(12) United States Patent
Shinohara

(10) Patent No.: US 7,250,970 B2
(45) Date of Patent: Jul. 31, 2007

(54) IMAGE PICKUP APPARATUS

(75) Inventor: Mahito Shinohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 796 days.

(21) Appl. No.: 10/644,850

(22) Filed: Aug. 21, 2003

(65) Prior Publication Data

US 2004/0036789 A1 Feb. 26, 2004

(30) Foreign Application Priority Data

Aug. 21, 2002 (JP) ............................ 2002-240554

(51) Int. Cl.
*H04N 3/14* (2006.01)

(52) U.S. Cl. .................... 348/308; 348/301; 348/302; 250/208.1; 257/191; 257/292

(58) Field of Classification Search ................ 348/281, 348/308, 302; 250/208.1; 257/292
See application file for complete search history.

(56) References Cited

U.S. PATENT DOCUMENTS

| | | | |
|---|---|---|---|
| 4,962,412 A | 10/1990 | Shinohara et al. ............ 357/30 |
| 5,008,206 A | 4/1991 | Shinohara et al. ............ 437/3 |
| 5,146,339 A | 9/1992 | Shinohara et al. ........... 358/212 |
| 5,280,358 A | 1/1994 | Yushiya et al. ........ 358/213.17 |
| 6,043,478 A * | 3/2000 | Wang ..................... 250/208.1 |
| 6,150,676 A * | 11/2000 | Sasaki ......................... 257/191 |
| 6,160,281 A * | 12/2000 | Guidash ..................... 257/292 |
| 6,163,023 A * | 12/2000 | Watanabe ................. 250/208.1 |
| 6,423,994 B1 * | 7/2002 | Guidash ..................... 257/292 |
| 6,836,291 B1 * | 12/2004 | Nakamura et al. .......... 348/301 |

| | | | |
|---|---|---|---|
| 2001/0001562 A1 * | 5/2001 | Orava et al. ................ 348/302 |
| 2002/0005473 A1 * | 1/2002 | Lauxtermann ........... 250/208.1 |
| 2002/0017661 A1 | 2/2002 | Shinohara ................... 257/238 |

FOREIGN PATENT DOCUMENTS

EP 0 862 219 A2 2/1998
JP 8-4131 1/1996

OTHER PUBLICATIONS

A. Yusa et al., "SIT Image Sensor: Design Considerations and Characteristics", *IEEE Transactions*, vol. ED-33, pp. 735-742, Jun. 1886.

(Continued)

*Primary Examiner*—David Ometz
*Assistant Examiner*—Pritham Prabhakher
(74) *Attorney, Agent, or Firm*—Fitzpatrick, Cella, Harper & Scinto

(57) ABSTRACT

An image pickup device including an array of a plurality of pixels including photoelectric conversion portions for accumulating signal charges generated by photoelectric conversion and an amplifying transistor for amplifying the signal charges generated by the photoelectric conversion portion to output the amplified signal charges, the device comprising: a junction-type field effect transistor, including a main electrode made of first semiconductor region of a first conduction type connected to control electrode region of the amplifying transistor, and a control electrode region made of second semiconductor region of a second conductive type opposite to the first conductivity type having same electric potential as that of semiconductor region of the second conduction type included in a semiconductor region forming the photoelectric conversion portions; and an electric potential supplying circuit for supplying predetermined electric potential to the main electrode regions of the a junction-type field effect transistor.

13 Claims, 10 Drawing Sheets

OTHER PUBLICATIONS

N. Tanaka et al., "A 310K Pixel Bipolar Imager (BASIS)", *IEEE Transactions Electron Devices*, vol. 37, pp. 964-997, No. 4, Apr. 1990.

S. Mendis et al., "A 128 x 128 CMOS Active Pixel Image Sensor for Highly Integrated Imaging Systems", *IEDM Tech. Digest*, 1993, pp. 583-586.

Nakamura et al., "Gate Accumulation Type MOS Photo Transistor Image Sensor", *National Conference of Television Society*, 3-7, 1986.

European Search Report dated Oct. 30, 2006 for related application No. 03018921.1-1235.

* cited by examiner

IMAGE PICKUP APPARATUS

BACKGROUND OF THE INVENTION

1. Field of the Invention

The present invention relates to an image pickup apparatus for picking up an object image.

2. Related Background Art

Conventionally, a charge coupled device (CCD) has been used as a solid-state image pickup device frequently because the CCD has a high signal to noise (S/N) ratio. On the other hand, the so-called amplification-type solid-state image pickup apparatus has been also developed because of its simple usage and of its low power consumption. The amplification-type solid-state image pickup apparatus is the device that introduces signal charges accumulated on light-receiving pixels to the control electrodes of transistors provided at pixel portions to output signals amplified by the transistors from their main electrodes. There are the following amplification-type solid-state image pickup apparatus: a static induction transistor (SIT) type image sensor using SITs as amplifying transistors (A. Yusa, J. Nishizawa et al., "SIT image sensor: Design consideration and characteristics," IEEE trans. Vol. ED-33 pp. 735-742, Jun. 1986), a bipolar amplifying solid-state image sensor (BASIS) using bipolar transistors (N. Tanaka et al., "A 310 K pixel bipolar imager (BASIS)," IEEE Trans. Electron Devices, vol. 35, pp. 646-652, May 1990), a charge modulation device (CMD) using a junction-type field effect transistor (JFETs) in which control electrodes form depletion layers (Nakamura et al., "Gate Accumulation Type MOS Phototransistor Image Sensor", National Conference of Television Society, 3-7, 1986), a complementary metal oxide semiconductor (CMOS) sensor using metal oxide semiconductor (MOS) transistors (S. K. Mendis, S. E. Kemeny and E. R. Fossum, "A 128×128 CMOS active image sensor for highly integrated imaging systems," in IEDM Tech. Dig., 1993, pp. 583-586), and the like. In particular, the CMOS sensor matches CMOS processes well and peripheral CMOS circuits can be formed on the chip of the CMOS sensor. Accordingly, the CMOS sensors are being energetically developed. A common problem of the amplification-type solid-state image pickup apparatus is that the amplifying transistors provide their respective output offsets to produce a fixed pattern noise (FPN) in signals of the image sensor. Conventionally, various signal reading circuits have been devised to remove the FPN. Besides, the CMOS sensor has the disadvantage that the number of transistors for constituting a pixel is large to make it difficult to reduce the area of the pixel.

FIG. 8 is a circuit diagram showing a conventional CMOS image sensor. In FIG. 8, a reference numeral 1 designates unit pixels. In FIG. 8, it is supposed to simplify descriptions that the CMOS image sensor has 2×2 unit pixels. A reference numeral 2 designates photodiodes for receiving light to accumulate signal charges. A reference numeral 3 designates MOS transistors for amplifying the signal charges. A reference numeral 4 designates transferring MOS transistors for transferring the signal charges accumulated in the photodiodes 2 to the gate electrode portions of the amplifying MOS transistors 3. A reference numeral 5 designates resetting MOS transistors for resetting the gate electrode potential of the amplifying MOS transistors 3. A reference numeral 6 designates electric power potential supplying lines. The drain electrodes of the amplifying MOS transistors 3 are connected to the electric power potential supplying lines 6. A reference numeral 7 designates pixel output lines. A reference numeral 8 designates switching MOS transistors for supplying reset electric potential through the output lines 7. A reference numeral 9 designates constant current supplying MOS transistors for supplying constant currents to the pixel output lines 7. A constant current supplying MOS transistor 9 makes the amplifying MOS transistors 3 of selected pixels operate as source followers through a switching MOS transistor 8, and causes the electric potential having a certain voltage difference from the gate potential of the amplifying MOS transistors 3 to appear on an output line 7. A reference numeral 10 designates transfer control lines for controlling the gate potential of the transferring MOS transistors 4. A reference numeral 11 designates reset control lines for controlling the gate potential of the resetting MOS transistors 5. A reference numeral 12 designates a control line for supplying pulses for controlling the gate electrodes of the switching MOS transistors 8. A reference numeral 13 designates a constant voltage supplying line for supplying a constant voltage to the gates of the MOS transistors 9 for making the MOS transistors 9 operate in their saturation region in order that the MOS transistors 9 operate as constant current supplying sources. A reference numeral 14 designates a pulse terminal for supplying transfer pulses to the transfer control lines 10. A reference numeral 15 designates a pulse supplying terminal for selecting all rows to be given a reset pulse. A reference numeral 16 designates a pulse supplying terminal for supplying a reset pulse to the reset control lines 11. A reference numeral 17 designates a vertical scanning circuit for selecting and scanning the rows of the pixels arranged in a matrix. A reference numeral 18 designates output lines of the vertical scanning circuit 17. A reference numeral 18-1 designates a first row selecting output line. A reference numeral 18-2 designates a second row selecting output line. A reference numeral 19 designates switching MOS transistors for introducing a pulse from the pulse terminal 14 to the control lines 10. A reference numeral 20 designates OR gates for receiving the outputs from the pulse supplying terminal 15 and from the vertical scanning circuit 17 as inputs thereto to designate a reset row. A reference numeral 21 designates switching MOS transistors for introducing a pulse from the pulse terminal 16 to the control lines 11. The gates of the MOS transistors 19 and 21 are connected to the row selecting output lines 18, and the row of the pixels to be driven is determined by the states of the row selecting output lines 18 and by the state of the terminal 15. Next, a reference numeral 22 designates readout circuits for reading out outputs from the pixels. A reference numeral 23 designates capacitors for holding reset signal outputs from the pixels. A reference numeral 24 designates capacitors for holding optical signal outputs from the pixels. A reference numeral 25 designates switching MOS transistors for turning on or off the electrical connections between the pixel output lines 7 and the capacitors 23. A reference numeral 26 designates switching MOS transistors for turning on or off the electrical connections between the pixel output lines 7 and the capacitors 24. A reference numeral 27 designates a noise output line to which reset outputs held by the capacitors 23 are led. A reference numeral 28 designates a signal output line to which optical signal outputs held by the capacitors 24 are led. A reference numeral 29 designates switching MOS transistors for turning on or off the electrical connections between the capacitors 23 and the noise output line 27. A reference numeral 30 designates switching MOS transistors for turning on or off the electrical connections between the capacitors 24 and the signal output line 28. A reference numeral 31 designates a noise output line resetting MOS transistor for resetting the electric potential of the noise output line 27. A reference numeral 32 designates a signal output line resetting MOS transistor for resetting the electric potential of the signal output line 28. A reference numeral 33 designates a power source terminal for supplying reset potential to the source electrodes of the resetting MOS transistors 31 and 32. A reference numeral 34 designates a horizontal scanning circuit for selecting sequentially the capacitors 23 and 24, which are provided at every column of the pixels arranged in the matrix, in order. A reference numeral 35-1 designates an output line for selecting a first column. A reference numeral 35-2 designates an output line for selecting a second column. The output lines 35-1 and 35-2 of the horizontal scanning circuit 34 are respectively connected to the gate of the switching MOS transistors 29 and 30. Moreover, a reference numeral 36 designates a pulse supplying terminal for applying pulses to the gates of the resetting MOS transistors 31 and 32. Reference numerals 37 and 38 designate pulse supplying terminals for applying pulses to the gates of the switching MOS transistors 25 and 26. A reference numeral 39 designates a differential amplifier for amplifying difference voltages between the noise output line 27 and the signal output line 28 and outputting the amplified difference voltages. A reference numeral 40 designates an output terminal of the differential amplifier 39. A reference numeral 41 designates a pulse supplying terminal to the gates of the MOS transistors 9. A reference numeral 42 designates a pulse supplying terminal to the gates of the MOS transistors 8. A reference numeral 43 designates a potential supplying terminal for supplying the reset potential to the pixel output lines 7 through the MOS transistors 8. Moreover, a reference numeral 44 designates the so-called floating diffusion (hereinafter, referred to as "FD") where the drains of the MOS transistors 4 and 5 and the gates of the MOS transistors 3 are connected and where signal charges are transferred from the MOS transistors 4.

Next, the timing chart of FIG. 9 is referred while the operation of the sensor of FIG. 8 is described. Incidentally, it is supposed that all of the MOS transistors shown in FIG. 8 are N type ones, and that they are turned on when their gate potential is the High level and turned off when their gate potential is the Low level. The numbers indicating timing pulses in FIG. 9 are set to coincide with the numbers of the pulse input terminals in FIG. 8.

First, when the level of the first row selecting output line 18-1 turns to the High level by the operation of the vertical scanning circuit 17, the first row of the pixel matrix is selected. Moreover, at this time, the level of the terminal 41 is the Low level, and the level of the terminal 42 is the High level. Consequently, the electric potential of the pixel output lines 7 is determined in accordance with the potential supplied from the terminal 43 (t1). First, when the level of the terminal 15 turns to the High level, the High level is transferred to the MOS switches 21 of all of the rows through the OR gates 20 to turn on the MOS switches 21. The electric potential of the FD 44 of all of the pixels is reset to the electric potential of the terminal 43 by a pulse supplied from the terminal 16 (t2). Next, when the level of the terminal 15 turns to the Low level, only the MOS switch 21 at the first row, which is the selected row, would be in the ON state thereof. In this state, when the electric potential of the terminal 43 is raised by a certain voltage, and when a pulse is supplied from the terminal 16, the electric potential of the FD 44 of the pixels at the first row is reset to the electric potential of the terminal 43 (t3). Next, the level of the terminal 42 is turned to the Low level to turn off the MOS switches 8, and the electric potential of the terminal 41 is set to the electric potential which makes it possible that the MOS transistors 9 supply constant currents. At this time, the gate potential of the MOS transistors 3 at the first row has been reset to the potential higher than the gate potential of the MOS transistors 3 on the other rows. The MOS transistors 3 on the first row operate as the source followers, and the MOS transistors 3 on the other rows are in their OFF state. Consequently, the sources of the amplifying MOS transistors 3 at the pixels on the selected first row are connected to the constant current sources 9. Thereby, the source follower outputs of the pixels are output on the output lines 7 (t4). In this state, when a High pulse is applied to the terminal 37, the reset outputs of the first row pixels are stored in the capacitors 23 through the MOS transistors 25 (t5). Next, a High pulse is applied to the terminal 14. Thereby, the High pulse is transmitted to the control line 10 through the switching MOS transistor 19 of the first row. Then, the signal charges accumulated in the photodiodes 2 are transferred to the gates of the MOS transistors 3 through the transferring MOS transistors 4. At this time, on the pixel output lines 7, there appears the electric potential corresponding to the outputs formed by adding the signals to the reset outputs of the pixels (t6). In this state, when a High pulse is applied to the terminal 38, the outputs formed by adding the signals to the reset outputs of the pixels are stored in the capacitors 24 through the MOS transistors 26 (t7). The reset outputs of the pixels show variation because the threshold voltage values of the MOS transistors 3 of respective pixels have variation. Consequently, the differences between the outputs stored in the capacitors 23 and 24 are pure signals without noises. When the horizontal scanning circuit 34 is then operated, the output lines 35-1 and 35-2 turn to the High level in order, and the outputs stored in the capacitors 23 and 24 of respective columns are led to the horizontal output lines 27 and 28 through the MOS transistors 29 and 30, respectively. Before the outputs of the High level pulses onto the output lines 35-1 and 35-2, it is necessary to set the level of the terminal 36 to the High level to reset the horizontal output lines 27 and 28 through the MOS transistors 32 and 31, respectively, in advance. The pixel reset outputs and the signal outputs added to the pixel reset levels are input into the differential amplifier 39 through the horizontal output lines 27 and 28, and the reset levels are subtracted by the differential amplifier 39. Thus, pixel signal free of noises are output from the output terminal 40 (t8, t9).

Next, when the level of the output line 18-1 is turned to the Low level and the level of the output line 18-2 is turned to the High level by the operation of the vertical scanning circuit 17, the second row of the pixels is selected. The pulse timing for driving the second row of the pixels is the same as the timing for driving the first one.

In the operation described above, the potential of the reset potential supplying terminal 43 is determined according to the characteristics of the MOS transistors 3. An electric potential change is set so that only the source followers of the selected row operate and the MOS transistors 3 of the unselected row take their non-conductive states.

As described above, even if there are no selecting MOS transistors in pixels, the CMOS sensor can be operated, and thereby can output signals having high S/N ratios.

However, even the CMOS sensor described above as a conventional technique includes three MOS transistors in one pixel in addition to a photodiode. On the other hand, an interline type CCD, which is the most frequently used solid-state image pickup device, includes only a transferring gate and a vertical CCD in addition to a photodiode in one pixel. Consequently, the CMOS sensor is yet disadvantageous in comparison with the CCD for forming a small size pixel.

Moreover, Japanese Patent Publication Gazette No. H08-004131 discloses the sensor in which the base electrodes of bipolar transistors for amplifying pixel signals are connected in series in the row directions by MOS type transistors and the bases are reset by means of the MOS transistors.

Even this sensor requires the wiring for the control electrodes of resetting MOS transistors connected in the row directions, and consequently it is difficult to reduce the area of the pixels thereof.

SUMMARY OF THE INVENTION

An object of the present invention is to provide an image pickup device which can achieve the reduction of the sizes of pixels.

For achieving the object mentioned above, as an embodiment, the present invention provides an image pickup device including an away of a plurality of pixels including photoelectric conversion portions for accumulating signal charges generated by photoelectric conversion and an amplifying transistor for amplifying the signal charges generated by the photoelectric conversion portion and outputting the amplified signal charges, comprising:

- a junction-type field effect transistor, including a main electrode region made of a first semiconductor region of a first conduction type connected to control electrode region of the amplifying transistor included in two pixels adjacent to each other, and a control electrode region made of a second semiconductor region of a second conduction type opposite to the first conductivity type having same electric potential as that of semiconductor region of the second conduction type included in a semiconductor region forming the photoelectric conversion portions, the junction type field effect transistors arranged in a same line connecting to each other in series;
- an electric potential supplying circuit for supplying predetermined electric potential to the main electrode region of the junction-type field effect transistor; and
- a potential control circuit for controlling electric potential of the first semiconductor region by means of capacity coupling.

DESCRIPTION OF THE PREFERRED EMBODIMENTS

A first to a third embodiments, which will be described in the following, include JFETs connected in series in row directions. The JFETs have the structure in which the FD of pixels adjacent to each other in a row direction is set to a main electrode, and in which a control electrode having the same electric potential as the well potential of the pixels of a CMOS sensor is formed at the middle portion of the FD of the adjacent pixels, i.e. the position corresponding to the device isolation portion of the conventional structure. Reset potential is supplied from the main electrodes of the JFETs at the ends of pixel regions to reset the FD of the pixels.

Embodiment 1

Figure 1:
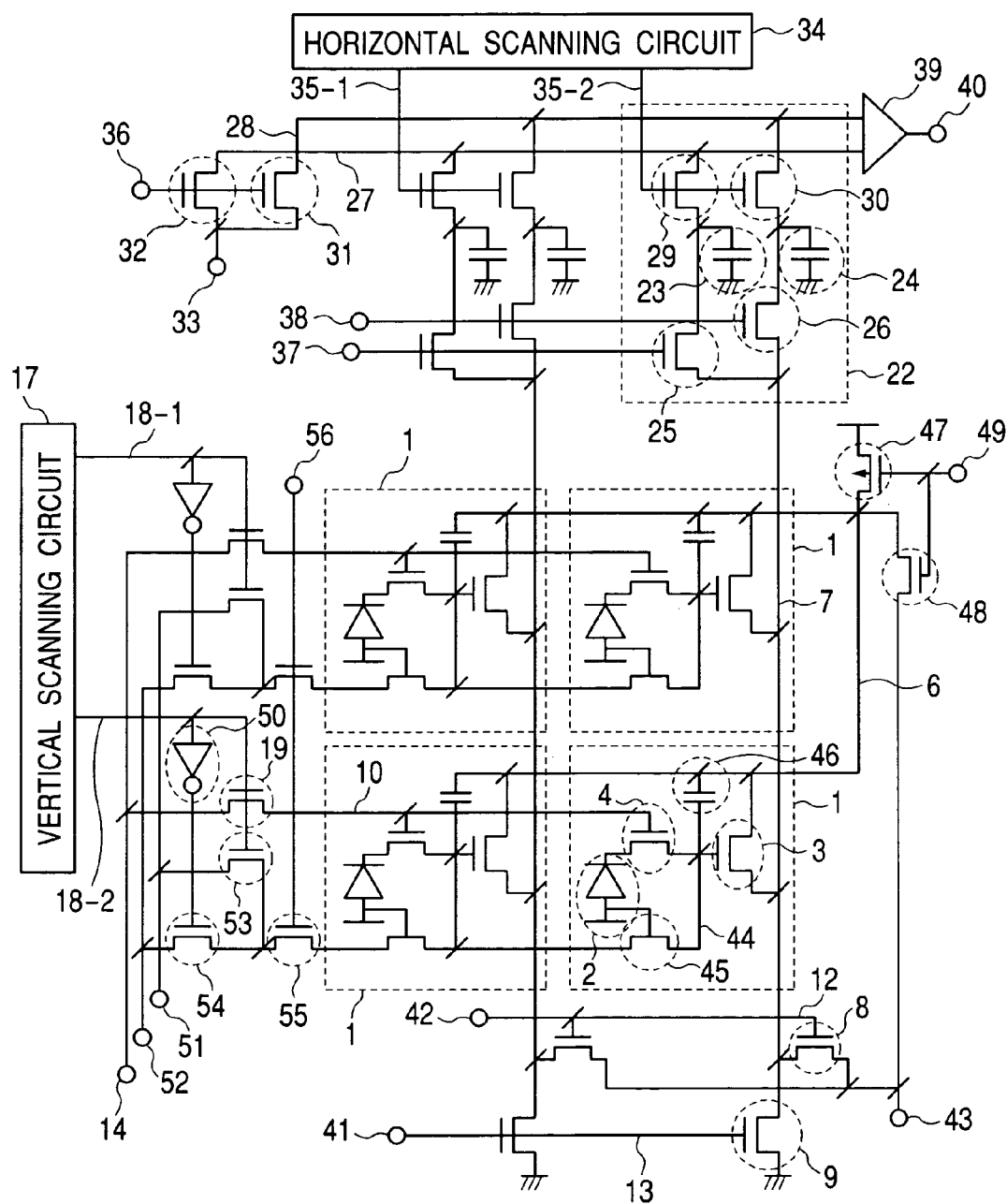
FIG. 1 is a circuit diagram of an image sensor for illustrating a first embodiment of the present invention.

FIG. 1 is an equivalent circuit diagram of an image sensor showing a first embodiment of the present invention. In FIG. 1, a reference numeral 45 designates a junction-type field effect transistor (JFETs). A JFET includes a source and a drain which are the floating diffusions (FD) adjacent to each other in a lateral direction, and a gate formed by semiconductor layer of the same conduction type as the semiconductor layer to be formed as the substrate of the photodiode 2, and of the MOS transistor 3. The gate of the JFET has the same potential as that of the substrate semiconductor. A reference numeral 46 designates capacitors provided between the drains of the amplifying transistors 3 and the FD 44. A reference numeral 47 designates a P type MOS transistor for turning on or off the connection between the power wiring 6 connected to the drains of the amplifying transistors 3 and the electric power source VDD. A reference numeral 48 designates a MOS transistor for turning on or off the connection between the wiring 6 and the potential supplying terminal 43. A reference numeral 49 designates a terminal for supplying a control pulse to the gate of the PMOS transistor 49 and to the gate of the MOS transistor 48. A reference numeral 50 designates inverters for inverting the outputs of the vertical scanning circuit 17. A reference numeral 51 designates a first reset potential supplying terminal for resetting the FD 44 of the pixels on a row to be selected in reading operation through the JFETs 45. A reference numeral 52 designates a second reset potential supplying terminal for resetting the FD 44 of the pixels on a row not to be selected in reading operation through the JFETs 45. A reference numeral 53 designates MOS transistors for controlling the supply of first reset potential to pixel portions. A reference numeral 54 designates MOS transistors for controlling the supply of second reset potential to pixel portions. A reference numeral 55 designates MOS transistors for turning on or off the connection between the first and the second reset potential supplying terminals 51 and 52 and the drains of the JFETs 45.

Figure 8:
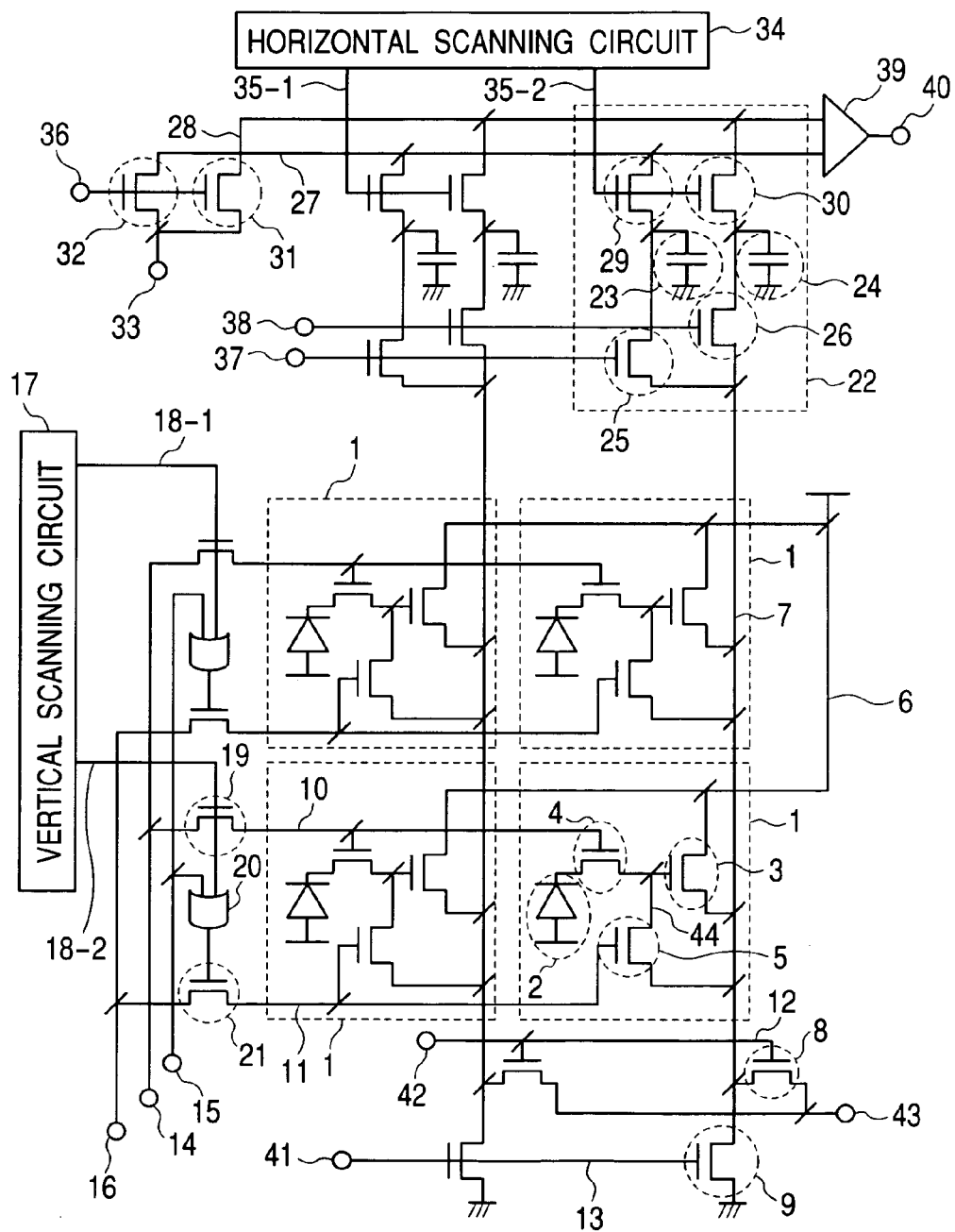
FIG. 8 is a circuit diagram showing an image sensor for illustrating a conventional example.
Figure 9:
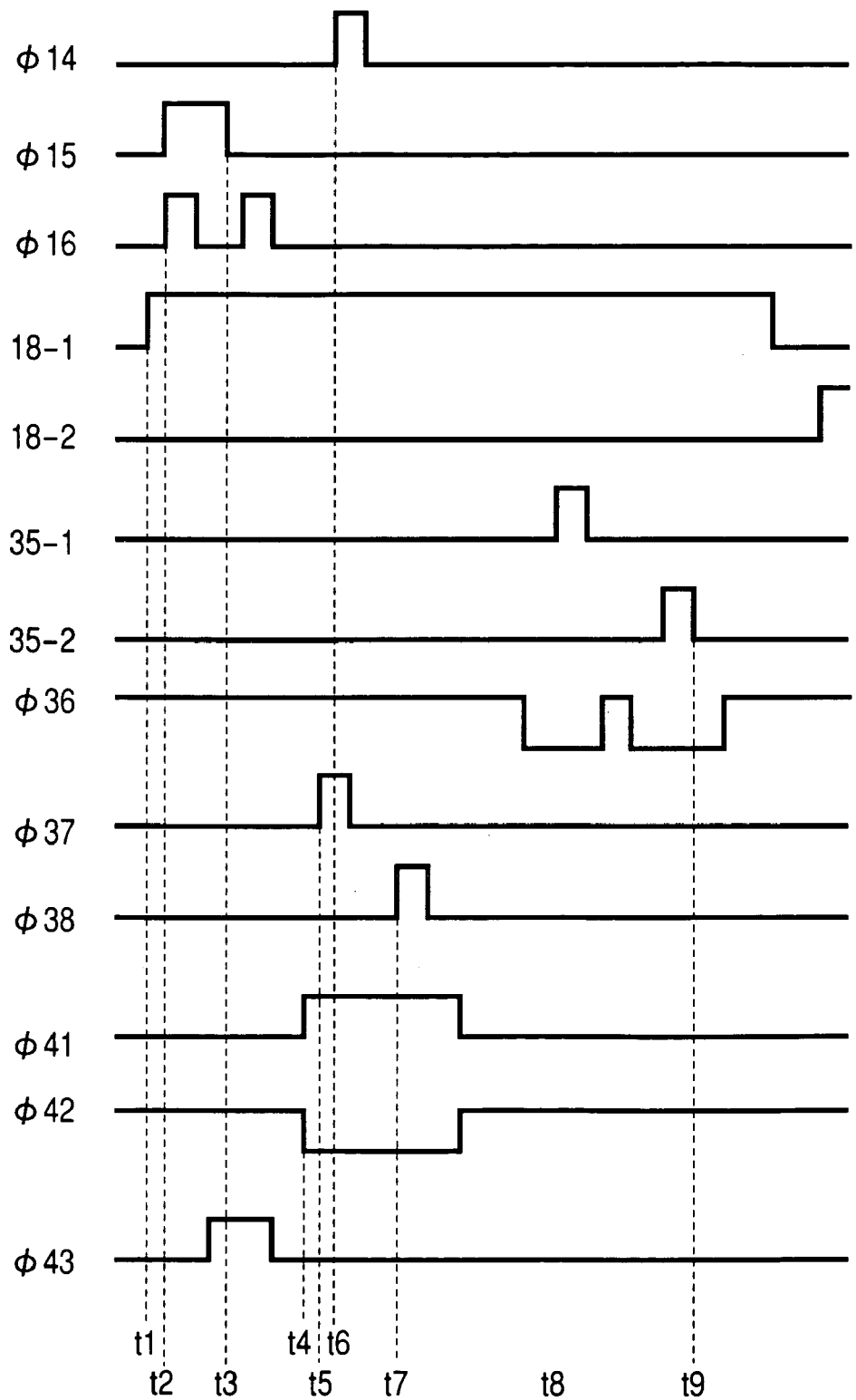
FIG. 9 is a timing chart for illustrating the operation of the conventional image sensor.

In FIG. 1, the capacitors 46 includes those generated parasitically and those designed intentionally. Moreover, in FIG. 1, the terminal 43 functions as a reset potential supplying terminal of the pixel output lines 7. Moreover, the pinch off voltages, i.e. the threshold voltages, of the JFETs 45 are set to −VPO. Consequently, when both of the potential of the sources and the drains of the JFETs 45 is VPO or more, the JFETs 45 are in their OFF states. When the potential of the sources or the drains of the JFETs 45 is less than VPO, the JFETs 45 are in their ON states. Moreover, when the potential of the reset terminal 51 of the FD of the pixels on a selected row is named to VR1, and when the potential of the reset terminal 52 of the FD of the pixels on an unselected row is named to VR2, the electric potential VR1 and VR2 are designed to be within a range of 0<VR2<VR1<VPO. When the pixel output line reset potential of the terminal 43 is named VR3, the electric potential VR3 is set to the potential of the ground level or the potential higher than the ground level by a little degree, which are sufficiently lower than the electric power source potential VDD. Incidentally, in FIG. 1, the same elements as those in FIG. 8 are designated by the same reference numerals as those in FIG. 8, and their descriptions are dispensed with.

Figure 2:
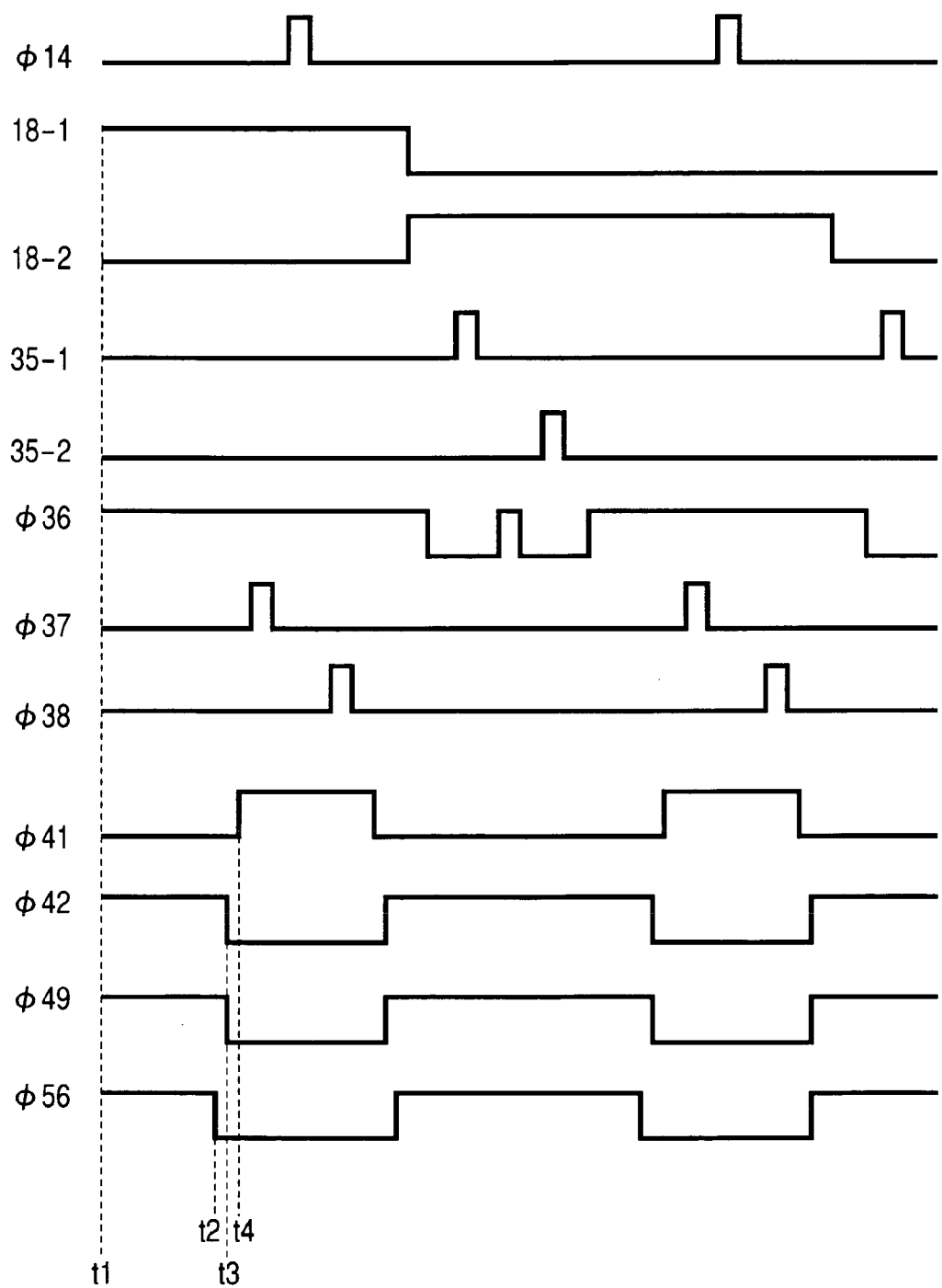
FIG. 2 is a timing chart for illustrating the operation of the image sensor of the first embodiment of the present invention.

Next, the timing chart of FIG. 2 is referred to while the operation of the sensor of FIG. 1 is described. Incidentally, the MOS transistors shown in FIG. 1 are supposed to N type ones unless otherwise mentioned. Then, the transistors are supposed to be in their ON states when the gate potential is the High level and to be in their OFF states when the gate potential is the Low level. Moreover, the numbers indicating timing pulses in FIG. 2 are set to coincide with the numbers of the pulse input terminals in FIG. 1.

First, when the level of the first row selecting output line 18-1 turns to the High level by the operation of the vertical scanning circuit 17, the first row of the pixel matrix is selected. Then, the FDs of the pixels on a selected row and an unselected row are reset. For the sake of the reset, the level of the terminal 41 is set to the Low level, and the levels of the terminals 42, 49 and 56 are set to the High level. Consequently, the electric potential of the power wiring 6 and the electric potential of the pixel output lines 7 are set to the potential VR3 supplied from the terminal 43. Moreover, the FD potential of the pixels on the first row, which is the selected row, is reset to the potential VR1 through the MOS transistors 53 and 55 and the JFETs 45. The FD potential of the pixels on the unselected row is reset to the potential VR2 through the MOS transistors 54 and 55 and the JFETs 45 (t1). After the completion of the reset of the FD 44, first, the level of the terminal 56 is turned to the Low level to turn off the MOS transistors 55, which are switches for supplying the FD reset potential to pixels (t2). When the levels of the terminals 42 and 49 are turned to the Low level immediately after the turning of the level of the terminal 56, the MOS transistors 8 and 48 are turned off and the P type MOS transistor 47 is turned on. Then, the electric potential of the wiring 6 rises from the potential VR3 to the electric power supply potential VDD. At this time, the FD potential of the pixels of the first row, which is the selected row, rises through the capacitors 46 and also through the capacity between the gates and the channels of the amplifying MOS transistors 3 when the amplifying MOS transistors 3 are in their ON states. The capacity between the gates and the cannels of the amplifying MOS transistors 3 contributes to the above-mentioned capacity coupling under the condition that the difference between the electric potential of the FD 44 and the electric potential of the pixel output lines 7 is smaller than the threshold values of the MOS transistors 3. The FD potential of the pixels of the unselected row similarly rises through the capacity coupling. However, because of the potential condition that VR2<VR1, the amplifying MOS transistors 3 of the unselected row are in the states nearer to their OFF states before the ON-OFF switching of the MOS transistors 47 and 48. Consequently, the effectiveness of the capacity between the gates and the channels of the MOS transistors 3 is smaller than that of the MOS transistors 3 of the selected row. Therefore, the quantity of the increase of the FD potential of the pixels of the unselected row is smaller than that of the pixels of the selected row. Incidentally, because the FD potential of the pixels of the unselected row is within the range of VR2<VR1 and the quantity of the increase of the potential is also smaller than that of the pixels of the selected row, the FD potential of the pixels of the unselected row becomes sufficiently lower than that of the pixels of the selected row after the above-mentioned operation. Moreover, at this time, it is necessary that the electric potential VR1, the electric potential VR3, the capacity of the capacitors 46, and the gate capacity of the MOS transistors 3 are designed so that the FD potential of the pixels of the selected row becomes sufficiently higher than the threshold voltage VPO. When the FD potential of the pixels of the selected row is sufficiently higher than the threshold voltage VPO, the JFETs 45 of the selected row turn to their OFF states, and each pixel of the selected row operates independently (t3). In this state, the electric potential of the terminal 41 is set to the electric potential which makes it possible that the MOS transistors 9 supply constant currents. The gate potential of the MOS transistors 3 of the first row, which is the selected row, has been reset to the electric potential higher than the gate potential of the MOS transistors 3 of the row other than the first row. The MOS transistors 3 of the first row operate as the source followers, and the MOS transistors 3 of the row other than the first row turn to their OFF states (t4). After this step, the pixels 1 and the reading circuits 22 are operated in the same manner as that described in the conventional technique. After the outputs from the pixels have been stored in the capacitors 23 and 24, the level of the output line 18-1 is turned to the Low level and the level of the output line 18-2 is turned to the High level in conformity with the operation of the vertical scanning circuit 17 just before the driving of the horizontal scanning circuit 34. That is, the selected row is switched to the second row. The FD potential of the pixels of the second row are reset during the horizontal scanning of the output signals of the first row. In turn, the FD potential of the pixels of the second row is reset to the electric potential VR1 and the FD potential of the pixels of the row other than the second row is rest to the electric potential VR2. After that, the operation described above is repeated.

Figure 3:
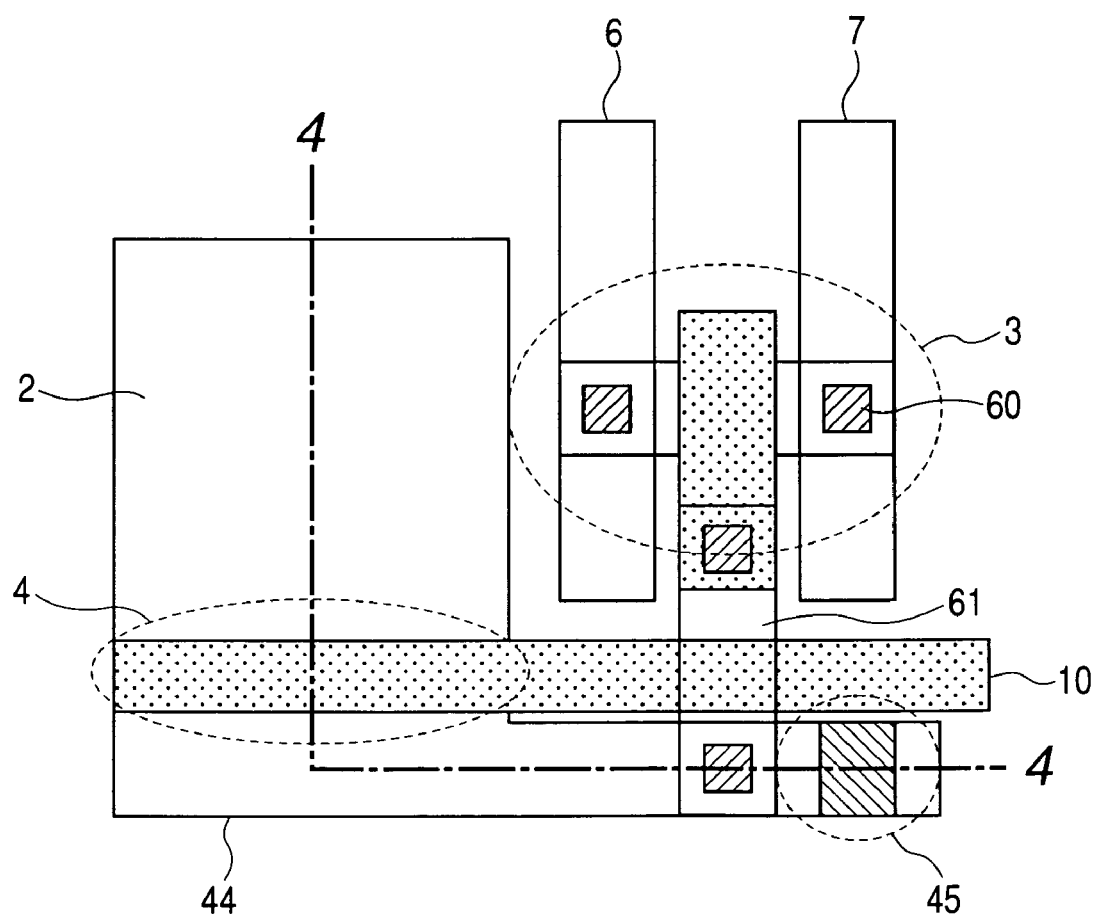
FIG. 3 is a plan layout view of a pixel for illustrating the first embodiment of the present invention.

FIG. 3 shows an example of a plane layout of a pixel of Embodiment 1 described with reference to FIG. 1. In FIG. 3, the same elements as those shown in FIG. 1 are designated by the same reference numerals as those in FIG. 1. The gate of the MOS transistor 4 is made of polysilicon exhibited by the use of the pattern shown by a reference numeral 10. The power wiring 6 and the pixel output line 7 are made of metal wiring. The pattern denoted by the reference numeral 45 indicates the channel portion of the JFET 45. The figures designated by a reference numeral 60 indicate contact holes for connecting the semiconductor layers or polysilicon wiring with the metal wiring 6 and 7. A reference numeral 61 designates metal wiring for connecting the FD 44 with the gate of the MOS transistor 3. Incidentally the capacitor 46 is supposed to be formed parasitically, and the capacitor 46 is not particularly shown in FIG. 3.

Figure 4:
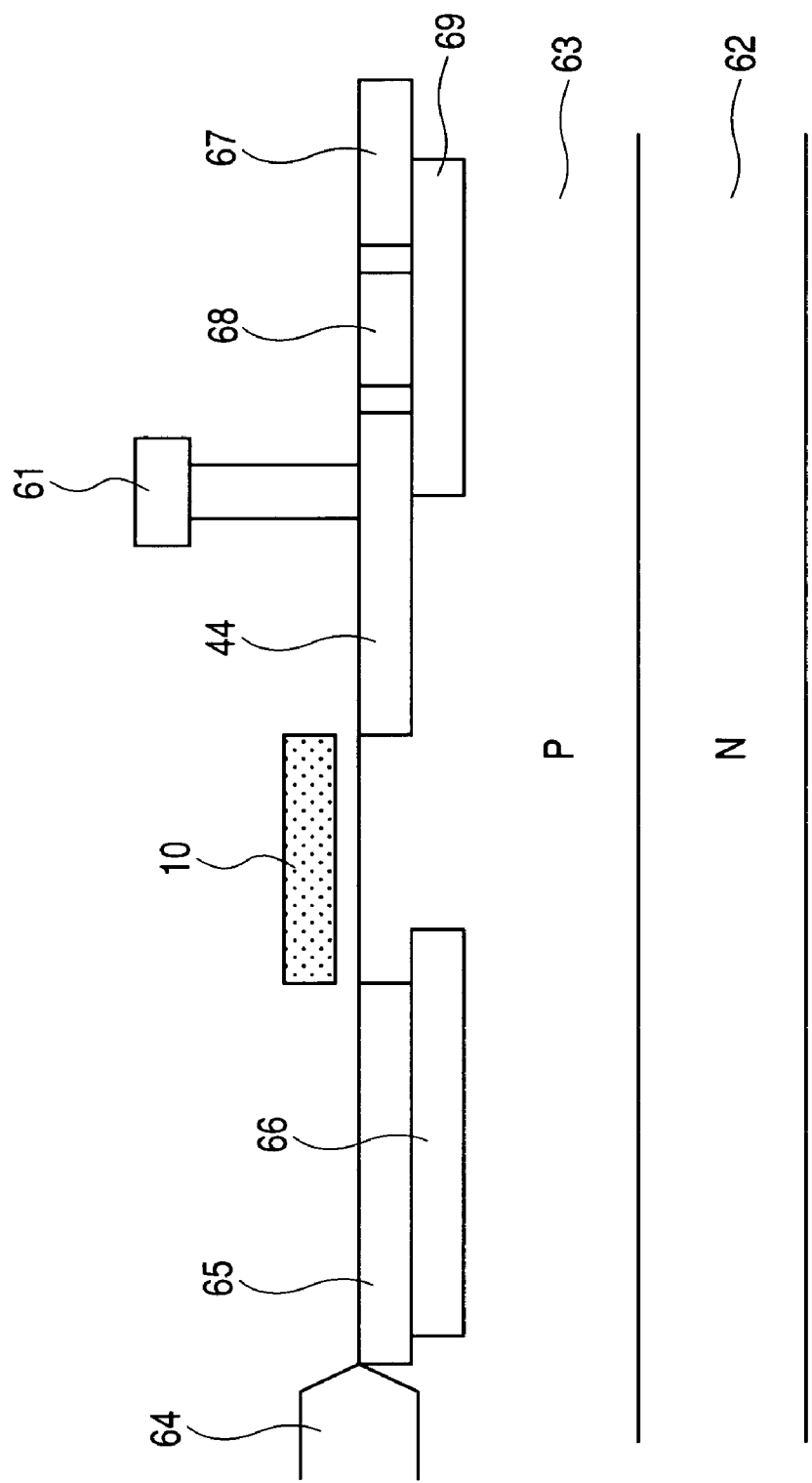
FIG. 4 is a structural view of a cross section of a pixel for illustrating the first embodiment of the present invention.

FIG. 4 shows the cross section along the 4-4 line in FIG. 3. In FIG. 4, the gate 10 of the transferring MOS transistor 4, the FD portion 44 and the connection wiring 61 from the FD portion 44 are designated by the same reference numerals as those in FIGS. 1 and 3. A reference numeral 62 designates an N type semiconductor substrate. A reference numeral 63 designates a P type well which is a substrate of the pixel. A reference numeral 64 designates a thick silicon oxide layer for device isolation. A reference numeral 65 designates a P type semiconductor layer formed at an interface of the semiconductor. A reference numeral 66 designates an N type semiconductor layer in which signal charges are accumulated. The P type well 63, the N type semiconductor layer 66 and the P type semiconductor layer 65 constitute a buried type photodiode. A reference numeral 67 designates the FD portion of an adjacent pixel. A reference numeral 68 designates a P type semiconductor layer. A reference numeral 69 designates an N type semiconductor layer. A JFET is composed of the FD 44 as the source thereof, the FD portion 67 as the drain thereof, the P type well 63 and the P type semiconductor layer 68 as the gate thereof, and the N type semiconductor layer 69 as the channel thereof. The gate 68 on one side of the JFET is formed so as to contact with the P type well 63 at a part arranged in the direction perpendicular to FIG. 4 to have the same potential as that of the P type well 63.

As shown in FIGS. 1 and 3, the number of MOS transistors used in the pixel are two: the amplifying MOS transistor 3 and the transferring MOS transistor 4 in the present first embodiment. Moreover, as shown in FIG. 4, the gate portion of a JFET is formed at a position where a device isolation portion is formed in the conventional technique. The JFET, therefore, do not need superfluous areas. In conclusion, the first embodiment can afford a smaller pixel than the conventional CMOS sensor pixel by the area of the resetting MOS transistor.

As described above, according to the first embodiment of the present invention, a CMOS sensor can be formed and operated in the structure in which no selecting MOS transistor and no FD resetting MOS transistor are provided in a pixel. Consequently, the invention can afford the image sensor which has smaller size pixels and outputs a high S/N ratio signals.

Embodiment 2

Figure 5:
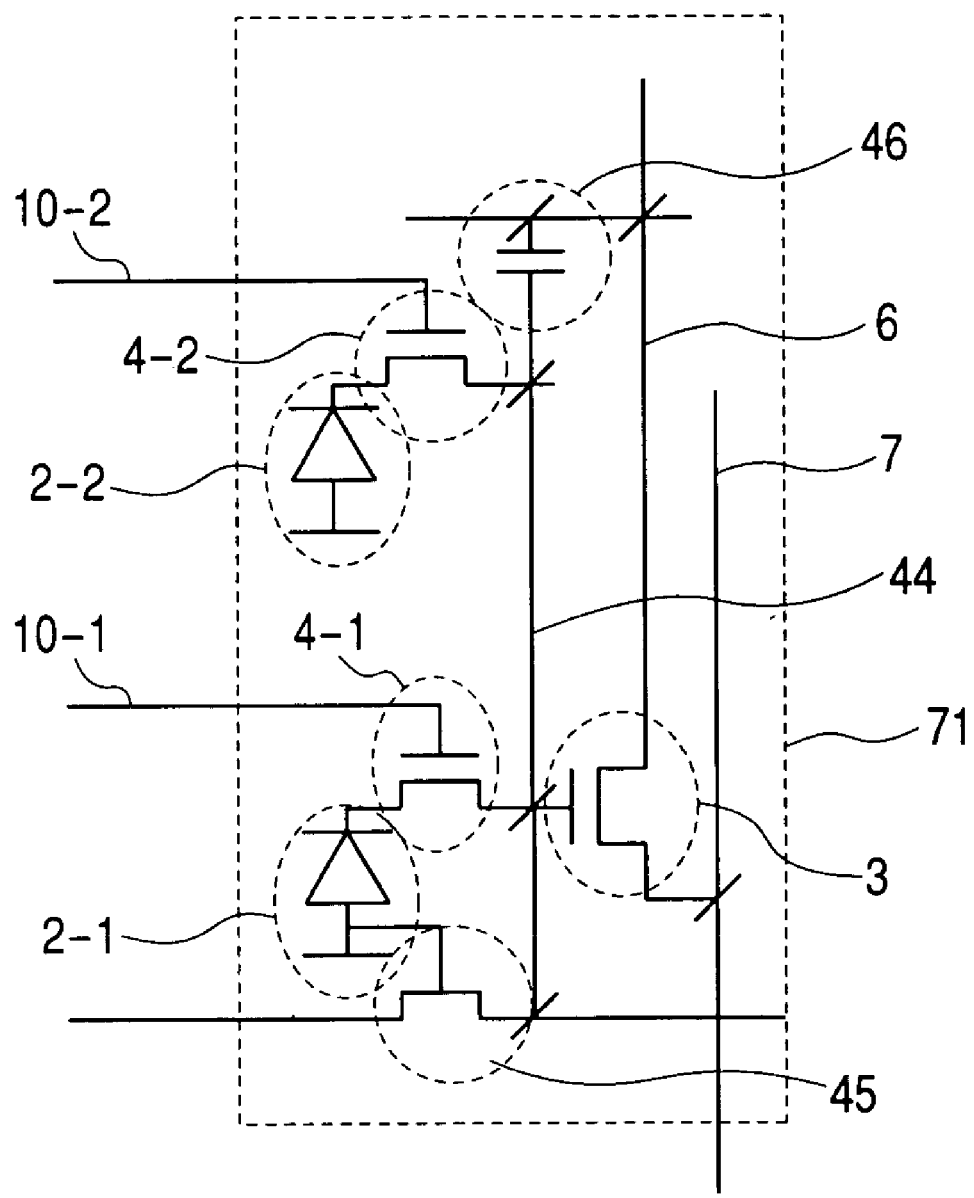
FIG. 5 is a circuit diagram of a pixel of an image sensor for illustrating a second embodiment of the present invention.

FIG. 5 is an equivalent circuit diagram of a pixel of a second embodiment (Embodiment 2) of the present invention. The circuit is configured so that one FD and one amplifying MOS transistor receive signal charges from independent two photodiodes. In FIG. 5, a reference numeral 71 designates a pixel unit including two photodiodes, i.e. a unit including two pixels of an image sensor. A reference numeral 2-1 designates a first photodiode included in the pixel unit 71. A reference numeral 2-2 designates the other photodiode. A reference numeral 4-1 designates a MOS transistor for transferring the signal charges of the photodiode 2-1. A reference numeral 4-2 designates a MOS transistor for transferring the signal charges of the photodiode 2-2. A reference numeral 10-1 designates a transferring gate line of the transferring MOS transistor 4-1. A reference numeral 10-2 designates a transferring gate line of the transferring MOS transistor 4-2. In FIG. 5, the elements same as those in FIG. 1 are designated by the same reference numerals as those in FIG. 1, and their descriptions are dispensed with.

The driving of an image sensor arranging the pixel units 71 of FIG. 5 therein is basically similar to the driving of the first embodiment. The vertical driving circuit outputs driving signals to each row of pixel units. The amplified output signal of each of the photodiodes 2-1 and 2-2 can be independently read by driving the gate lines 10-1 and 10-2 independently.

In the above-mentioned Embodiment 2, the pixel unit 71 is configured to include two photodiodes 2-1 and 2-2. However, the pixel unit 71 may be configured to include three photodiodes or more.

Embodiment 2 described above requires only one amplifying MOS transistor and one JFET for a plurality of photodiodes. Consequently, the number of the MOS transistors needed to one pixel of an image sensor is smaller than that in the first embodiment. Hence, the second embodiment can provide an image sensor capable of outputting a signal having a high S/N ratio from further smaller pixel.

Embodiment 3

Figure 6:
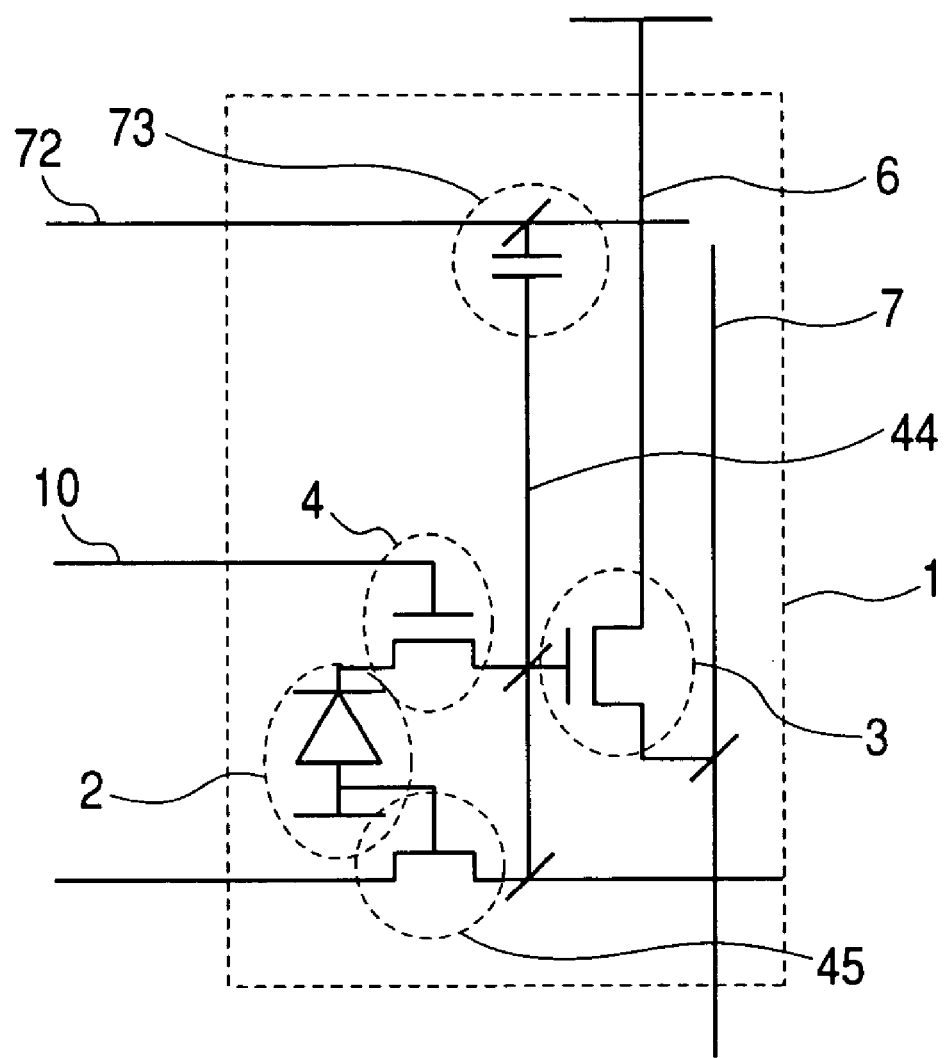
FIG. 6 is a circuit diagram of a pixel of an image sensor for illustrating a third embodiment of the present invention.

FIG. 6 is an equivalent circuit diagram of a pixel of a third embodiment (Embodiment 3) of the present invention. In FIG. 6, a reference numeral 72 designates a row selecting line. A reference numeral 73 designates a capacitor formed between the FD 44 and the row selecting line 72. In FIG. 6, the elements same as those in FIG. 1 are designated by the same reference numerals as those in FIG. 1, and their descriptions are dispensed with.

Embodiment 3 differs from Embodiment 1 in that the power source wiring 6 is fixed to the power source VDD, and in that only one kind of the reset potential for resetting the FD 44 through the JFET 45 is used. The selection of a row for reading signals is performed by switching the electric potential of the row selecting line 72 from the Low level to the High level to raise the electric potential of the FD 44 through the capacity coupling by the capacitor 73. The following two respects are the same as those in Embodiment 1. That is, the supply of the reset potential to the JFET 45 is turned off by a switch such as the MOS transistor 55 shown in FIG. 1 just before the switching of the level of the row selecting line 72 to the High level, and the electric potential of the FD 44 of a selected row is raised to a sufficiently higher level than the pinch off voltage VPO of the JFET 45. After that, amplified signals of the pixels on the selected row are output to the readout circuit 22 as in Embodiment 1. A period from the time when a row is selected once to the time when the row is selected again is at least one field period. The reset of the FD 44 may be performed during this period. The present embodiment has enough time for the reset operation in comparison with Embodiment 1, in which a selected row is determined by means of the supply potential of FD resetting and the FD resetting of the selected row should be performed during one horizontal scanning period.

Incidentally, the number of the row selecting lines of the pixel shown in FIG. 6 is increased in comparison with that of a pixel shown in FIG. 1. However, it is possible to configure the row selecting mechanism such that the power supplying lines 6 of the amplifying MOS transistors 3 are laid in the row directions, and that the electric potential of the power supplying lines 6 is made to be independently controlled at every row to use the power supplying lines 6 as both the power supplying lines 6 and the row selecting lines 72.

It is also possible to do without lines 72 by connecting the transfer control lines 10 to the capacitors 73 and by giving lines 10 double usage: charge transfer control and row selection. In this structure, lines 10 are supplied with three state pulse consisting of low minus level, middle ground level and high plus level.

In these cases, the number of the elements of the row selecting mechanism is not larger in comparison with that of a pixel in FIG. 1. Moreover, embodiment 3 can be also applied to the configuration in which one amplifying MOS transistor 3 corresponds to a plurality of photodiodes 2-1 and 2-2 as shown in Embodiment 2.

As described above, according to Embodiment 3, the number of MOS transistors necessary for a unit pixel is small. Consequently, pixels constituting a CMOS image sensor can be reduced. In addition, enough time for resetting FD can be shared. Consequently, Embodiment 3 can be also applied to an image sensor in which horizontal scanning is high speed. Therefore, Embodiment 3 can provide an image sensor, which is composed of a small size pixel and outputs a high S/N ratio signal at a high speed.

Embodiment 4

Figure 10:
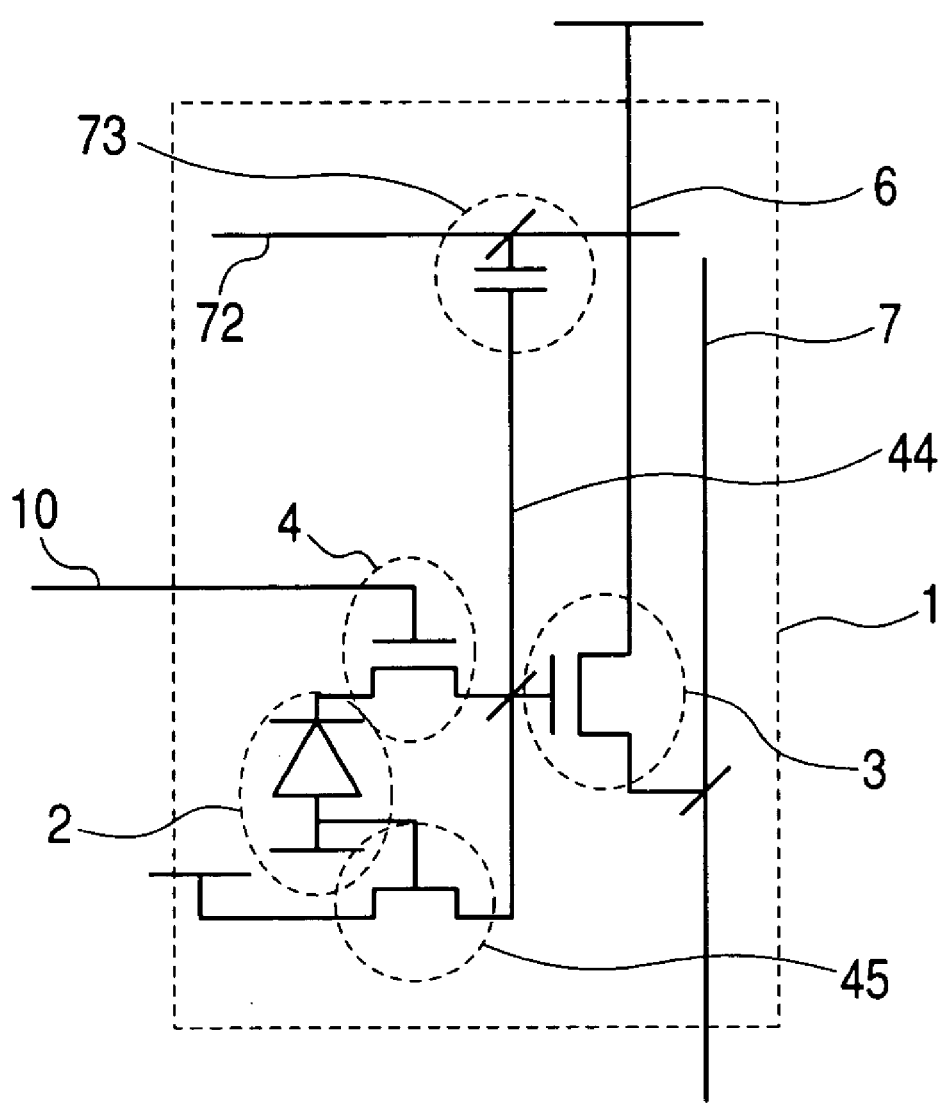
FIG. 10 is an equivalent circuit diagram of a pixel of a fourth embodiment of the present invention.

FIG. 10 is an equivalent circuit diagram of a pixel of a fourth embodiment (Embodiment 4) of the present invention. In FIG. 10, the elements same as those in FIG. 6 are designated by the same reference numerals as those in FIG. 6, and their descriptions are dispensed with.

Embodiment 4 differs from embodiment 3 in that a main electrode of the JFET 45 is connected not to the JFET of the adjacent pixel, but to a reset potential supply method. In FIG. 10, the JFET is connected to the power source. It is possible to use the pixel output line or other potential source as the reset potential source. The potential of the reset potential source should be set above the pinch off potential of the JFET in order to cut off the JFET channel at time of the row selection. The row selection is operated by changing the potential of the row selecting line 72 as in the same manner as in the embodiment 3.

In embodiment 4, it-is possible to do without lines 72 by using the transfer control lines 10 as row selecting lines with 3 state pulse or by using laterally laid power supply lines as row selecting lines as mentioned in embodiment 3.

The device of the embodiment 4 can greatly reduce the FD reset time, compared with that of the embodiment 1-3.

The embodiment 4 can, therefore, afford the image sensor with short cycle operation.

The embodiment 4 can be applied to a pixel structure in which one FD region receives from a plurality of photodiodes as mentioned in embodiment 2.

The pixel described in connection with Embodiments 1, 2, 3 and 4 is basically configured by the use of an N type MOS transistor, an N type JFET, both formed on a P type substrate (P type well), and the signal charge carrier of electrons. However, the pixel may be basically configured by the use of a P type MOS transistor, a P type JFET, both formed on an N type substrate, and the signal charge carriers of holes. Moreover, although the driving circuits of pixels are formed on only one side of the pixel array in FIG. 1, the driving circuits may be formed on both sides of the pixel array. In this case, the resetting potential of the FD of the pixel is supplied from both sides of the pixel array, and thereby the time necessary for resetting the FD can be shortened. Moreover, the amplifying transistor of pixel may be another type transistor such as a junction-type field effect transistor or the like in place of the MOS transistor.

Moreover, in Embodiments 1-4 described above, the configurations in which the transferring MOS transistor is provided between the amplifying transistor and the photodiode were shown. However, the present invention can be applied to the configuration in which the transferring MOS transistor is omitted and the amplifying transistor and the photodiode are directly connected to each other.

In the case of this configuration, a signal generated by the first photodiode is read from the amplifying transistor, and thereafter a signal obtained by resetting the FD is read. Consequently, reset noises cannot be reduced, and the performance of this configuration is inferior in the respect of the noses. However, the configuration can bring about further more reduction of the sizes of pixels.

Embodiment 5

An image pickup system using the image sensors described in connection with Embodiments 1-4 described above will be described on the basis of FIG. 7.

Figure 7:
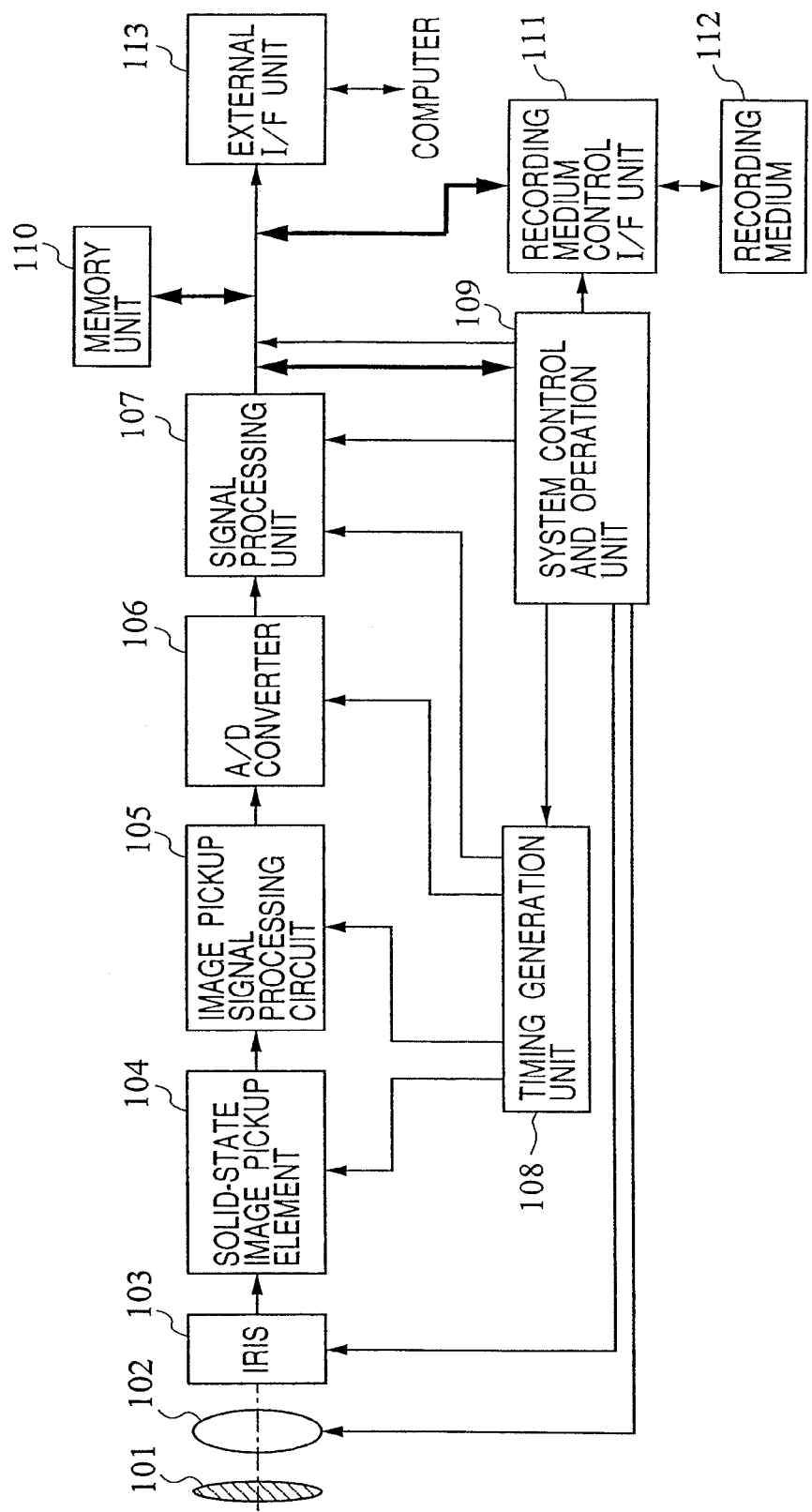
FIG. 7 is a diagram showing an image pickup system for illustrating a fourth embodiment of the present invention.

In FIG. 7, a reference numeral 101 designates a barrier to be used as both of a protector of a lens and a main switch. A reference numeral 102 designates the lens for forming an optical image of a subject on an image sensor 104. A reference numeral 103 designates an iris for changing the quantity of the light which has passed through the lens 102. The reference numeral 104 designates the image sensor for taking in the subject image formed by the lens 102 as an image signal. A reference numeral 105 designates an image pickup signal processing circuit including a variable gain amplifier unit for amplifying image signals output from the image sensor 104, a gain correction circuit unit for correcting gain values, and the like. A reference numeral 106 designates an analog-to-digital (A/D) converter for performing the A/D conversion of the image signal output from the image sensor 104. A reference numeral 107 designates a signal processing unit for performing various corrections of the image data output from the A/D converter 106 and for compressing the image data. A reference numeral 108 designates a timing generation unit for outputting various timing signals to the image sensor 104, the image pickup signal processing circuit 105, the A/D converter 106 and the signal processing unit 107. A reference numeral 109 designates a system control and operation unit for performing various operations and for controlling the whole image pickup system. A reference numeral 110 designates a memory unit for storing image data temporarily. A reference numeral 111 designates an interface unit for performing recording or reading on a recording medium. A reference numeral 112 designates the detachably mountable recording medium such as a semiconductor memory or the like for performing the recording or the reading of image data. A reference numeral 113 designates an interface unit for communicating with external computers and the like.

Next, the operation of a still video camera at the time of photographing by means of the configuration described above.

When the barrier 101 is opened, a main power source is turned on. Then, the power source for control systems is turned on. Furthermore, the power source for image pickup system circuits such as the A/D converter 106 and the like is turned on.

Then, for controlling luminous exposure, the system control and operation unit 109 makes the iris 103 open. The signal output from the image sensor 104 is converted by the A/D converter 106. After that, the converted signal is input into the signal processing unit 107.

The system control and operation unit 109 performs the calculation of exposure on the basis of the input data.

The system control and operation unit 109 judges the brightness on the basis of the result of the photometry. The system control and operation unit 109 controls the iris 103 on the basis of the result of the judgment.

Next, the system control and operation unit 109 extracts high frequency components from the output signal from the image sensor 104 to calculation the distance to the subject. After that, the system control and operation unit 109 drives the lens 102 to judge whether focusing has been attained or not. When the system control and operation unit 109 judges that focusing is not attained, the system control and operation unit 109 again drives the lens 2, and performs distance measurement.

Then, after the confirmation of focusing, the system control and operation unit 109 starts main exposure.

After the completion of the exposure, image signal output from the image sensor 104 is converted by the A/D converter 106 to pass through the signal processing unit 107, and is written into the memory unit 110 by the system control and operation unit 109.

After that, the data stored in the memory unit 110 passes through the recording medium control I/F unit 111 and is recorded on the detachably mountable recording medium 112 such as a semiconductor memory or the like under the control of the system control and operation unit 109.

Moreover, images may be processed by being input into computers or the like directly through the external I/F unit 113.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image pickup device comprising an array of a plurality of pixels including photoelectric conversion portions for accumulating signal charges generated by photoelectric conversion and an amplifying transistor for amplifying the signal charges generated by said photoelectric conversion portion to output the amplified signal charges, said device comprising:

a junction-type field effect transistor comprising a main electrode made of a first semiconductor region of a first conduction type connected to a control electrode region of said amplifying transistor included in two pixels adjacent to each other, and a control electrode region made of a second semiconductor region of a second conduction type opposite to the first conductive type having the same electric potential as that of a semiconductor region of the second conduction type included in a semiconductor region forming said photoelectric conversion portions, said junction-type field effect transistors arranged in a same line connecting to each other in series;

an electric potential supplying circuit for supplying predetermined electric potential to the main electrode region of said junction-type field effect transistor; and a potential control circuit for controlling electric potential of said first semiconductor region by means of capacity coupling.

2. An image pickup device according to claim 1, further comprising a transferring transistor for transferring the signal charges accumulated in said photoelectric conversion portion included in said pixel.

3. An image pickup device according to claim 2, comprising a potential control circuit for controlling electric potential of said first semiconductor region by means of capacity coupling.

4. An image pickup device according to claim 3, wherein said potential control circuit is wiring connected to the gate electrode region of said transferring transistor.

5. An image pickup device according to claim 1, wherein said first semiconductor region constitutes a part of said photoelectric conversion portion.

6. An image pickup device according to claim 1, wherein said potential control circuit is wiring connected to the main electrode region of said amplifying transistor.

7. An image pickup device according to claim 1, wherein said potential supplying circuit can selectively supply first electric potential and second electric potential different from the first electric potential, said image pickup device further comprising a first driving circuit for controlling said potential supplying circuit so as to supply the first electric potential to a plurality of the pixels from which signals are read, and to supply the second electric potential to a plurality of the pixels from which no signals are read.

8. An image pickup device according to claim 1, further comprising:

a second driving circuit having a first mode in which electric potential is applied to said main electrode of said junction-type field effect transistor from said potential supplying circuit to connect in series said first semiconductor region included in each of the plurality of pixels and thereby reset said first semiconductor regions, and a signal obtained by the reset is output from said amplifying transistor, and a second mode for reading a signal corresponding to said signal charges obtained by said photoelectric conversion portion from said amplifying transistor; and a differential circuit for processing a difference between the signal obtained in said first mode and the signal obtained in said second mode.

9. An image pickup device according to claim 1, wherein each of said plurality of pixels includes an amplifying transistor common to a plurality of photoelectric conversion portions and a transferring transistor for connecting the plurality of photoelectric conversion portions to said common amplifying transistor.

10. An image pickup system comprising:

an image pickup device defined in claim 1;

a lens for focusing light onto said plurality of pixels;

an analog-to-digital conversion circuit for converting signals from said plurality of pixels to digital signals; and a signal processing circuit for processing signals from said analog-to-digital conversion circuit.

11. An image pickup device comprising an array of a plurality of pixels including photoelectric conversion portions for accumulating signal charges generated by photoelectric conversion, and an amplifying transistor for amplifying the signal changes generated by said photoelectric conversion portion to output the amplified signal charges, said device comprising:

a junction-type field effect transistor comprising:

a first main electrode made of a first semiconductor region of a first conduction type connected to a control electrode region of said amplifying transistor;

a control electrode region made of a second semiconductor region of a second conduction type opposite to the first conductive type having the same electric potential as that of a semiconductor region of the second conduction type included in a semiconductor region forming said photoelectric conversion portions;

a second main electrode made of a third semiconductor region of a first conduction type connected to a potential supply portion for supplying a predetermined electric potential; and a potential control circuit for controlling electric potential of said first semiconductor region by means of capacity coupling.

12. An image pickup device according to claim 11, further comprising a transferring transistor for transferring the signal charges accumulated in said photoelectric conversion portion included in said pixel, wherein said potential control circuit is a line connected to the gate region of said transferring transistor both for controlling said transferring transistor and for controlling electric potential of said first semiconductor region by means of capacity coupling.

13. An image pickup system comprising:

an image pickup device defined in claim 11;

a lens for focusing light onto said plurality of pixels;

an analog-to-digital conversion circuit for converting signals from said plurality of pixels to digital signals; and a signal processing circuit for processing signals from said analog-to-digital conversion circuit.

* * * * *

UNITED STATES PATENT AND TRADEMARK OFFICE
CERTIFICATE OF CORRECTION

| | |
|---|---|
| PATENT NO. | : 7,250,970 B2 |
| APPLICATION NO. | : 10/644850 |
| DATED | : July 31, 2007 |
| INVENTOR(S) | : Mahito Shinohara |

It is certified that error appears in the above-identified patent and that said Letters Patent is hereby corrected as shown below:

ON THE TITLE PAGE ITEM [56] REFERENCES CITED

Other Publications, Line 3, "1886." should read --1986.--.

ON THE TITLE PAGE ITEM [57] ABSTRACT

Line 17, "a" should be deleted.

COLUMN 3

Line 37, "referred" should read --referred to--.

COLUMN 4

Line 45, "signal" should read --signals--.

COLUMN 5

Line 21, "away" should read --array--.

Line 29, "to" should read --to a--.

Line 37, "junction type" should read --junction-type--.

COLUMN 6

Line 9, "embodiments," should read --embodiment,--.

Line 16, "i.e." should read --i.e.,--.

Line 25, "(JFETs)." should read --(JFET).--.

Line 60, "includes" should read --include--.

Line 64, "i.e." should read --i.e.,--.

UNITED STATES PATENT AND TRADEMARK OFFICE
CERTIFICATE OF CORRECTION

PATENT NO. : 7,250,970 B2
APPLICATION NO. : 10/644850
DATED : July 31, 2007
INVENTOR(S) : Mahito Shinohara It is certified that error appears in the above-identified patent and that said Letters Patent is hereby corrected as shown below:

COLUMN 7

Line 18, "to" should read --to be--.

COLUMN 8

Line 38, "are" should read --is--.

Line 42, "rest" should read --reset--.

COLUMN 9

Line 24, "JFET," should read --JFETs,--.

Line 33, "a" should be deleted.

Line 44, "i.e." should read --i.e.,--.

COLUMN 10

Line 4, "to" should read --for--.

Line 6, "from" should read --from a--.

COLUMN 11

Line 27, "embodiment" should read --embodiments--.

Line 46, "of" should read --of the--.

Line 60, "noses." should read --noises.--.

Line 61, "more" should be deleted.

UNITED STATES PATENT AND TRADEMARK OFFICE
CERTIFICATE OF CORRECTION

| | |
|---|---|
| PATENT NO. | : 7,250,970 B2 |
| APPLICATION NO. | : 10/644850 |
| DATED | : July 31, 2007 |
| INVENTOR(S) | : Mahito Shinohara |

It is certified that error appears in the above-identified patent and that said Letters Patent is hereby corrected as shown below:

<u>COLUMN 12</u>

Line 54, "calculation" should read --calculate--.

<u>COLUMN 14</u>

Line 30, "changes" should read --charges--.

Signed and Sealed this

Sixth Day of May, 2008

JON W. DUDAS
*Director of the United States Patent and Trademark Office*